(12) United States Patent
Fan et al.

(10) Patent No.: US 10,037,725 B2
(45) Date of Patent: Jul. 31, 2018

(54) DRIVING METHODS OF GRAPHENE DISPLAY DEVICES AND GRAPHENE DISPLAY DEVICES

(71) Applicant: Shenzhen China Star Optoelectronics Technology Co., Ltd., Shenzhen, Guangdong (CN)

(72) Inventors: Yong Fan, Guangdong (CN); Yu-chun Hsiao, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 179 days.

(21) Appl. No.: 15/038,648

(22) PCT Filed: Apr. 25, 2016

(86) PCT No.: PCT/CN2016/080154
§ 371 (c)(1),
(2) Date: May 23, 2016

(87) PCT Pub. No.: WO2017/173682
PCT Pub. Date: Oct. 12, 2017

(65) Prior Publication Data
US 2018/0090044 A1    Mar. 29, 2018

(30) Foreign Application Priority Data

Apr. 6, 2016 (CN) .................. 2016 1 0209228 0

(51) Int. Cl.
 *G09G 3/20* (2006.01)
 *H01L 33/26* (2010.01)
 (Continued)

(52) U.S. Cl.
 CPC ............. *G09G 3/2003* (2013.01); *G09G 3/32* (2013.01); *H01L 27/156* (2013.01);
 (Continued)

(58) Field of Classification Search
 CPC ... G09G 2300/0452; G09G 2320/0276; G09G 2320/0666
 See application file for complete search history.

(56) References Cited

U.S. PATENT DOCUMENTS

2007/0165161 A1* 7/2007 Kao .................. G02F 1/133514
                                                              349/114
2011/0050718 A1   3/2011 Wang
(Continued)

FOREIGN PATENT DOCUMENTS

CN       101984487 A     3/2011
WO    WO2011036994 A1    3/2011

OTHER PUBLICATIONS

Y. Xiong, L. Wang, W. Xu, J. Zou, H. Wu, Y. Xu, J. Peng, J. Wang, Y. Cao, G. Yu, "Performance analysis of PLED based flat panel display with RGBW sub-pixel layout", Org. Electron., 10 (2009), p. 857.*

(Continued)

Primary Examiner — Kee M Tung
Assistant Examiner — Grace Q Li
(74) Attorney, Agent, or Firm — Andrew C. Cheng

(57) ABSTRACT

The present disclosure relates to a driving method of graphene display device and the graphene display devices. The method includes obtaining target point coordinates of a pixel within a color gamut system by RGB grayscale values to be inputted by the pixels, obtaining chromaticity coordinate (CIE) or a brightness of a first dynamic sub-pixel and a second dynamic sub-pixel of the pixel according to a location relationship of three color gamut blocks divided by a RGB color gamut within the target point coordinate and a gamut coordinate system, determining a driving voltage of the pixel in accordance with the CIE or the brightness of the first dynamic sub-pixel and the second dynamic sub-pixel, and outputting the driving voltage to the pixel. The graphene (Continued)

display device may for quickly, effectively, and more convenient realize high color fidelity so as to enhance the performance of LCDs.

12 Claims, 2 Drawing Sheets

(51) Int. Cl.
　　　H01L 33/00　　　(2010.01)
　　　H01L 27/15　　　(2006.01)
　　　G09G 3/32　　　　(2016.01)
(52) U.S. Cl.
　　　CPC .......... *H01L 33/0041* (2013.01); *H01L 33/26* (2013.01); *G09G 2300/0452* (2013.01); *G09G 2320/0276* (2013.01); *G09G 2320/0626* (2013.01); *G09G 2320/0666* (2013.01)

(56) References Cited

U.S. PATENT DOCUMENTS

| | | |
|---|---|---|
| 2014/0225940 A1 | 8/2014 | Nakagawa et al. |
| 2015/0009450 A1* | 1/2015 | Xiong ................. G02F 1/13473 349/62 |
| 2015/0124271 A1* | 5/2015 | Robinson ............. H04N 1/6008 358/1.9 |
| 2016/0079319 A1 | 3/2016 | Lim et al. |
| 2017/0256679 A1 | 9/2017 | Fan |

OTHER PUBLICATIONS

S.-C.Pei, Y.-C.Zeng, C.-H. Chang, "Virtual restoration of ancient chinese paintings using color contrast enhancement and lacuna texture synthesis", IEEE Trans. Image Process., vol. 13, No. 3, pp. 416-429, Mar. 2004.*

* cited by examiner

DRIVING METHODS OF GRAPHENE DISPLAY DEVICES AND GRAPHENE DISPLAY DEVICES

BACKGROUND OF THE INVENTION

1. Field of the Invention

The present disclosure relates to liquid crystal display technology, and more particularly to a driving method of graphene display device and the graphene display device.

2. Discussion of the Related Art

With the popularity and the development of liquid crystal devices (LCDs), users demands toward high performance LCDs have been grown. Even those display devices of three base colors (RGB) or the display devices of four base colors (RGBY) cannot satisfy gamut covers demand of the display devices.

Recently, the graphene light-emitting components have been developed so as to be widely adopted. The graphene is characterized by hard quality, high transparency (the transmittance is about 97.7%), high thermal conductivity coefficient (about 5300 W/m·K), high transfer rate of electrons (over 15000 cm2/V·s), and so on, and thus may be applicable in display devices. In particular, the graphene may be applicable on touch panels for replacing conventional conductive film (ITO) and LEDs. Through theoretical calculation, the color gamut may reach up to 158%. However, there is still no such solution to provide high gamut covers.

SUMMARY

The present disclosure relates to a driving method of graphene display devices and a graphene display device for quickly, effectively, and more convenient realize high color fidelity to enhance the performance of LCDs.

In one aspect, a driving method of graphene display devices, each of the pixels of the graphene display device includes two dynamic sub-pixels, the method includes: obtaining target point coordinates of a pixel within a color gamut system by RGB grayscale values to be inputted by the pixels; obtaining chromaticity coordinate (CIE) or a brightness of a first dynamic sub-pixel and a second dynamic sub-pixel of the pixel according to a location relationship of three color gamut blocks divided by a RGB color gamut within the target point coordinate and a gamut coordinate system; determining a driving voltage of the pixel in accordance with the CIE or the brightness of the first dynamic sub-pixel and the second dynamic sub-pixel; and outputting the driving voltage to the pixel.

Wherein the step of obtaining the CIE or a brightness of a first dynamic sub-pixel and a second dynamic sub-pixel of the pixel according to a location relationship of three color gamut blocks divided by a RGB color gamut within the target point coordinate and a gamut coordinate system further includes: determining the gamut block where the target point coordinate falls; determining the CIE of the first dynamic sub-pixel and the second dynamic sub-pixel in accordance with the gamut block where the target point coordinate falls and a location of the target point coordinate within the gamut block; and obtaining the brightness of the first dynamic sub-pixel and the second dynamic sub-pixel in accordance with the target point coordinate, a brightness value formed by the RGB grayscale values, the CIE of the first dynamic sub-pixel and the CIE of the second dynamic sub-pixel.

Wherein the step of obtaining the brightness of the first dynamic sub-pixel and the second dynamic sub-pixel in accordance with the target point coordinate, a brightness value formed by the RGB grayscale values, the CIE of the first dynamic sub-pixel and the CIE of the second dynamic sub-pixel further includes: taking the CIE of the target point coordinate as the CIE of a mixed color of the two dynamic sub-pixels and taking the target brightness value formed by the RGB grayscale value as the brightness value of a mixed color of the two dynamic sub-pixels; and respectively obtaining the brightness of the two dynamic sub-pixels in accordance with the respective brightness, the CIEs, and a relationship between the CIE and the brightness of the mixed color of the two dynamics sub-pixels.

Wherein the step of obtaining the target point coordinates of a pixel within a color gamut system by RGB grayscale values to be inputted by the pixels further includes:
configuring the CIE corresponding to the inputted RGB grayscale values to respectively be $R(u'_R, v'_R)$, $C(u'_G, v'_G)$, and $B(u'_B, v'_B)$, and according to equation (1):

$$\begin{cases} u' = \dfrac{u'_R \times \dfrac{L_{Rg}}{v'_R} u'_G \times \dfrac{L_{Gg}}{v'_G} + u'_B \times \dfrac{L_{Bg}}{v'_B}}{\dfrac{L_{Rg}}{v'_R} + \dfrac{L_{Gg}}{v'_G} + \dfrac{L_{Bg}}{v'_B}} \\ v' = \dfrac{L_{Rg} + L_{Gg} + L_{Bg}}{\dfrac{L_{Rg}}{v'_R} + \dfrac{L_{Gg}}{v'_G} + \dfrac{L_{Bg}}{v'_B}} \end{cases} \quad (1)$$

the target point coordinate is (u', v'), wherein the brightness formed by the RGB grayscale values are respectively $L_{Rg}$, $L_{Gg}$, and $L_{Bg}$.

Wherein the step of respectively obtaining the brightness of the two dynamic sub-pixels in accordance with the respective brightness, the CIEs, and a relationship between the CIE and the brightness of the mixed color of the two dynamics sub-pixels further includes: obtaining the brightness value formed by the grayscale value of the first dynamic sub-pixel ($L_{Xg}$) and the brightness value formed by the grayscale value of the second dynamic sub-pixel ($L_{Yg}$) by equation (2):

$$\begin{cases} L_{Xg} = \dfrac{\dfrac{u'_R * v'_Y - u'_D * v'_Y}{u'_D * v'_R - u'_Y * v'_R} * (L_{Rg} + L_{Gg} + L_{Bg})}{1 + \dfrac{u'_R * v'_Y - u'_D * v'_Y}{u'_D * v'_R - u'_Y * v'_R}} \\ L_{Yg} = L_{Rg} + L_{Gg} + L_{Bg} - L_{Xg} \end{cases} \quad (2)$$

wherein the CIEs of the corresponding RGB grayscale values are $R(u'_R, v'_B)$, $G(u'_G, v'_G)$, $B(u'_B, v'_B)$, the brightness values formed by the RGB grayscale values are respectively $L_{Rg}$, $L_{Gg}$, and $L_{Bg}$, the CIE of the second dynamic sub-pixel is $Y(u'_Y, v'_Y)$, and the CIE of the mixed color of the first dynamic sub-pixel and the second dynamic sub-pixel is $D(u'_D, v'_D)$; and the CIE (D) is obtained by converting the target point coordinate.

Wherein before the step of obtaining target point coordinates of a pixel within a color gamut system by RGB grayscale values to be inputted by the pixels, the method further includes:

dividing the RGB color gamut into three gamut blocks WBR, WGR, and WBG.

Wherein the step of determining the CIE of the first dynamic sub-pixel and the second dynamic sub-pixel in accordance with the gamut block where the target point coordinate falls and a location of the target point coordinate within the gamut block further includes: when the target point coordinate is within the WBR color gamut block, the CIE of the first dynamic sub-pixel is the red CIE; when the target point coordinate is within the WGR color gamut block, the CIE of the first dynamic sub-pixel is the blue CIE; when the target point coordinate is within the WBG color gamut block, the CIE of the first dynamic sub-pixel is the red CIE; and the CIE of the second dynamic sub-pixel is the CIE of an intersection between a connecting line of the target point coordinate and the CIE corresponding to the first dynamic sub-pixel and edge lines configured by the graphene display device.

In another aspect, a graphene display device, includes: a display unit and a driving unit electrically connecting to the display unit, the display unit includes a plurality of pixels, each of the pixels includes two dynamic sub-pixels, the display unit obtains a target point coordinate of the pixel within a gamut coordinate system in accordance with the inputted RGB grayscale values, the display unit also obtains chromaticity coordinate (CIE) or brightness of the first dynamic sub-pixel and the second dynamic sub-pixel in accordance with a location relationship of three color gamut blocks divided by a RGB color gamut within the target point coordinate and a gamut coordinate system; the display unit also determines a driving voltage of the pixel in accordance with the CIE or the brightness of the first dynamic sub-pixel and the second dynamic sub-pixel; and the driving unit outputs the driving voltage to the pixel.

Wherein the display unit: determines the gamut block where the target point coordinate falls; determines the CIE of the first dynamic sub-pixel and the second dynamic sub-pixel in accordance with the gamut block where the target point coordinate falls and a location of the target point coordinate within the gamut block; and obtains the brightness of the first dynamic sub-pixel and the second dynamic sub-pixel in accordance with the target point coordinate, a brightness value formed by the RGB grayscale values, the CIE of the first dynamic sub-pixel and the CIE of the second dynamic sub-pixel.

Wherein the display unit: determines takes the CIE of the target point coordinate as the CIE of a mixed color of the two dynamic sub-pixels and takes the target brightness value formed by the RGB grayscale value as the brightness value of the mixed color of the two dynamic sub-pixels; and respectively obtains the brightness of the two dynamic sub-pixels in accordance with the respective brightness, the CIEs, and a relationship between the CIE and the brightness of the mixed color of the two dynamics sub-pixels.

Wherein the display unit configures the CIE corresponding to the inputted RGB grayscale values to respectively be $R(u'_R, v'_R)$, $G(u'_G, v'_G)$, and $B(u'_B, v'_B)$, and according to equation (1):

$$\begin{cases} u' = \dfrac{u'_R \times \dfrac{L_{Rg}}{v'_R} u'_G \times \dfrac{L_{Gg}}{v'_G} + u'_B \times \dfrac{L_{Bg}}{v'_B}}{\dfrac{L_{Rg}}{v'_R} + \dfrac{L_{Gg}}{v'_G} + \dfrac{L_{Bg}}{v'_B}} \\ v' = \dfrac{L_{Rg} + L_{Gg} + L_{Bg}}{\dfrac{L_{Rg}}{v'_R} + \dfrac{L_{Gg}}{v'_G} + \dfrac{L_{Bg}}{v'_B}} \end{cases} \quad (1)$$

the target point coordinate is (u', v'), wherein the brightness formed by the RGB grayscale values are respectively $L_{Rg}$, $L_{Gg}$, and $L_{Bg}$.

Wherein the display unit obtains the brightness value formed by the grayscale value of the first dynamic sub-pixel ($L_{Xg}$) and the brightness value formed by the grayscale value of the second dynamic sub-pixel ($L_{Yg}$) by equation (2):

$$\begin{cases} L_{Xg} = \dfrac{\dfrac{u'_R * v'_Y - u'_D * v'_Y}{u'_D * v'_R - u'_Y * v'_R} * (L_{Rg} + L_{Gg} + L_{Bg})}{1 + \dfrac{u'_R * v'_Y - u'_D * v'_Y}{u'_D * v'_R - u'_Y * v'_R}} \\ L_{Yg} = L_{Rg} + L_{Gg} + L_{Bg} - L_{Xg} \end{cases} \quad (2)$$

wherein the CIEs of the corresponding RGB grayscale values are $R(u'_R, v'_R)$, $G(u'_G, v'_G)$, $B(u'_B, v'_B)$, the brightness values formed by the RGB grayscale values are respectively $L_{Rg}$, $L_{Gg}$, and $L_{Bg}$, the CIE of the second dynamic sub-pixel is $Y(u'_Y, v'_Y)$, and the CIE of the mixed color of the first dynamic sub-pixel and the second dynamic sub-pixel is $D(u'_D, v'_D)$; and the CIE (D) is obtained by converting the target point coordinate.

Wherein the display unit divides the RGB color gamut into three gamut blocks WBR, WGR, and WBG.

Wherein the display unit is configured for: when the target point coordinate is within the WBR color gamut block, the CIE of the first dynamic sub-pixel is the red CIE; when the target point coordinate is within the WGR color gamut block, the CIE of the first dynamic sub-pixel is the blue CIE; when the target point coordinate is within the WBG color gamut block, the CIE of the first dynamic sub-pixel is the red CIE; and the CIE of the second dynamic sub-pixel is the CIE of an intersection between a connecting line of the target point coordinate and the CIE corresponding to the first dynamic sub-pixel and edge lines configured by the graphene display device.

Compared to the conventional technology, each of the pixels of the graphene display device includes two dynamic sub-pixels. The target point coordinate of the pixel within the gamut coordinate system is determined in accordance with the inputted RGB grayscale values. The CIE or the brightness of the first dynamic sub-pixel and the second dynamic sub-pixel may be obtained by the relationship of the three gamut blocks divided by the target point coordinate and the RGB color gamut. The driving voltage of the pixel may be determined by the CIE or the brightness of the first dynamic sub-pixel and the second dynamic sub-pixel, and is outputted. In this way, the gamut display of the graphene display device may reach up to 158%, which is more than any other displays. The gamut of the graphene display device may completely cover the gamut range of real objects. The quality of displayed color and the performance of the display may be greatly enhanced.

DETAILED DESCRIPTION OF THE EMBODIMENTS

Embodiments of the invention will now be described more fully hereinafter with reference to the accompanying drawings, in which embodiments of the invention are shown.

Figure 1:
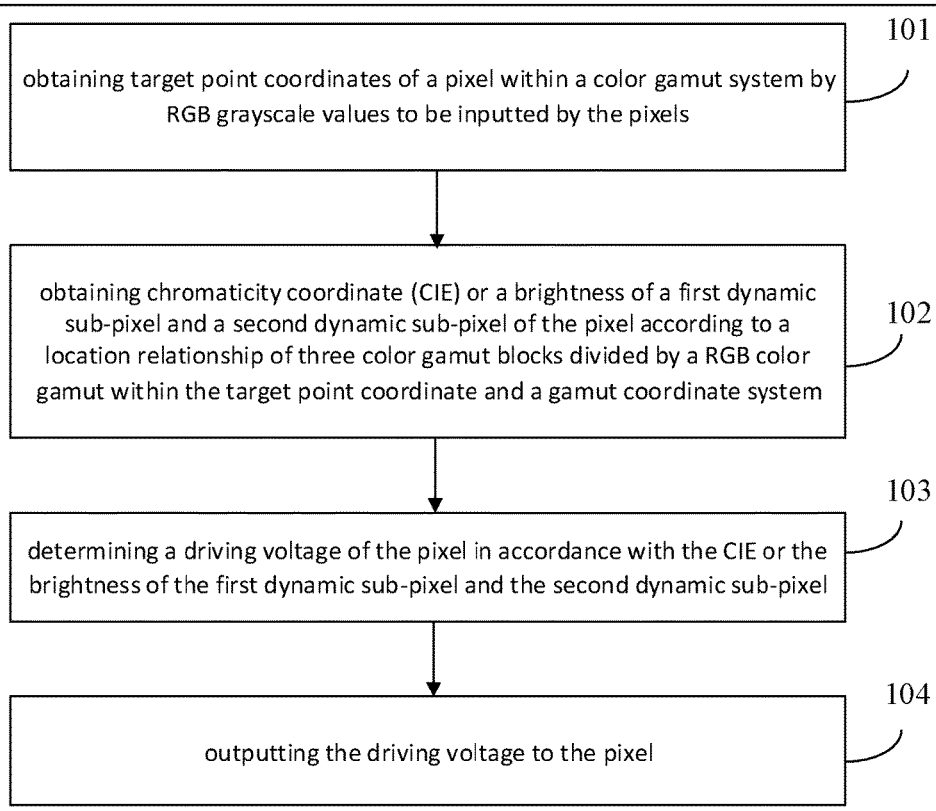
FIG. 1 is a flowchart of the driving method of the graphene display device in accordance with one embodiment.

FIG. 1 is a flowchart of the driving method of the graphene display device in accordance with one embodiment.

As shown in FIG. 1, the method includes the following steps:

In step S101, obtaining target point coordinates of a pixel within a color gamut system by the RGB grayscale values to be inputted by the pixels.

In one embodiment, each of the pixels of the graphene display device includes two dynamic sub-pixels. As the grayscale values of the inputted RGB are different, the two dynamic sub-pixels are not fixed. The brightness and the chromaticity coordinates (CIEs) of the two dynamic sub-pixels are determined in accordance with the inputted RGB grayscale values so as to implement the display color gamut of the graphene display device.

Figure 2:
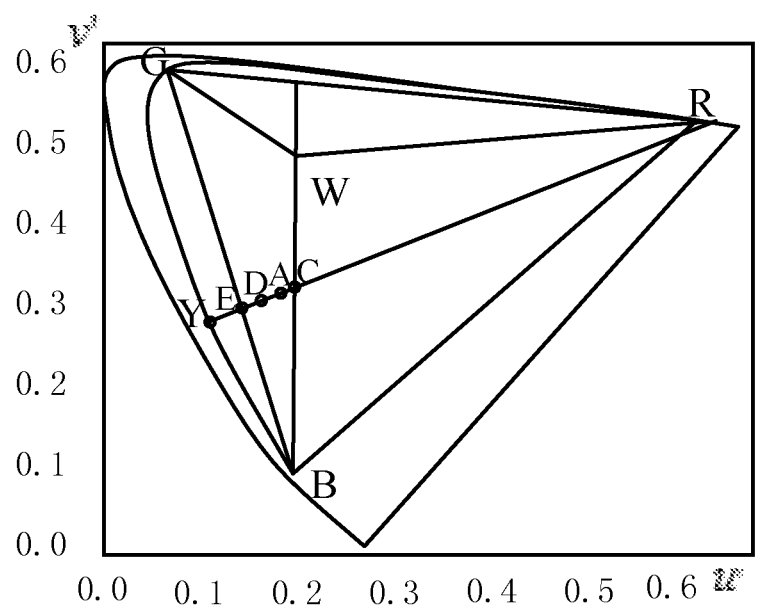
FIG. 2 is a schematic view of the color gamut display range of the graphene display device in accordance with one embodiment.

Specifically, as shown in FIG. 2, the RGB color gamut of the graphene display device is divided into three color gamut including WBR, WGR, and WBG to obtain the color or the CIE of the two dynamic sub-pixels corresponding to the inputted RGB grayscale values. Preferably, in order to provide more smooth color transition of each of the color gamut block and the whole color gamut, in the embodiment, uniform color coordinate system is adopted, such as CIE1976.

After the color gamut blocks are divided, the graphene display device determines the target point coordinate system of the corresponding pixel within the color gamut system. In an example, the coordinate of the target point is (u', v'), the CIEs of the corresponding RGB grayscale values are $R(u'_R, v'_R)$, $G(u'_G, v'_G)$, $B(u'_B, v'_B)$, and the brightness values formed by the RGB grayscale values are respectively $L_{Rg}$, $L_{Gg}$, and $L_{Bg}$. The target CIE (u', v') may be obtained by equation (1).

$$\begin{cases} u' = \dfrac{u'_R \times \frac{L_{Rg}}{v'_R} + u'_G \times \frac{L_{Gg}}{v'_G} + u'_B \times \frac{L_{Bg}}{v'_B}}{\frac{L_{Rg}}{v'_R} + \frac{L_{Gg}}{v'_G} + \frac{L_{Bg}}{v'_B}} \\ v' = \dfrac{L_{Rg} + L_{Gg} + L_{Bg}}{\frac{L_{Rg}}{v'_R} + \frac{L_{Gg}}{v'_G} + \frac{L_{Bg}}{v'_B}} \end{cases} \quad (1)$$

In step S102, obtaining the CIE or the brightness of the first dynamic sub-pixel and the second dynamic sub-pixel of the pixel according to a location relationship of the three color gamut blocks divided by a RGB color gamut within the target point coordinate and a color.

After the target point coordinate (u', v') is determined by equation (1), the color gamut block where the target point coordinate is located is determined.

Specifically, when the target point coordinate is within the WBR color gamut block, the CIE of the first dynamic sub-pixel is the red CIE. When the target point coordinate is within the WGR color gamut block, the CIE of the first dynamic sub-pixel is the blue CIE. when the target point coordinate is within the WBG color gamut block, the CIE of the first dynamic sub-pixel is the red CIE.

After the target point coordinate is determined, the CIE of the second dynamic sub-pixel is determined in accordance with an intersection of a connecting line between the target point coordinate and the color corresponding to the first dynamic sub-pixel and an edge line defining the gamut. Specifically, the CIE of the second dynamic sub-pixel is determined by referring to a predetermined table via a slope factor of the connecting line between the target point coordinate and the CIE of the color corresponding to the first dynamic sub-pixel.

Further, when the target point coordinate falls within the WBR gamut block, the CIE of the first dynamic sub-pixel is red CIE. As shown in FIG. 2, the triangle formed by the connecting lines of the three points WBR substantially overlap with the edge lines of the graphene. When the target point coordinate falls within the WBR gamut block, the point coordinate of the mixed color of the first dynamic sub-pixel and the second dynamic sub-pixel is replaced by the target point coordinate. In addition, a target brightness value formed by the RGB grayscale value is taken as the brightness value of the mixed color of the first dynamic sub-pixel and the second dynamic sub-pixel, as shown by equation (2) below.

$$\begin{cases} v' = \dfrac{L_{Xg} + L_{Yg}}{\frac{L_{Xg}}{v'_R} + \frac{L_{Yg}}{v'_Y}} \\ L_{Xg} + L_{Yg} = L_{Rg} + L_{Gg} + L_{Bg} \end{cases} \quad (2)$$

The coordinate of the target point is (u', v'), the brightness values formed by the RGB grayscale values are respectively $L_{Rg}$, $L_{Gg}$, and $L_{Bg}$, the CIE of the second dynamic sub-pixel is $Y(u'_Y, v'_Y)$, the brightness value formed by the grayscale value of the first dynamic sub-pixel is $L_{Xg}$, and the brightness value formed by the grayscale value of the second dynamic sub-pixel is $L_{Yg}$.

The CIE obtained by equation (1) is taken into equation (2) for calculation to obtain the brightness value formed by the grayscale value of the first dynamic sub-pixel $L_{Xg}$ and the brightness value formed by the grayscale value of the second dynamic sub-pixel $L_{Yg}$, as shown by equation (3).

$$\begin{cases} L_{Xg} = \dfrac{\frac{u'_R * v'_Y - u' * v'_Y}{u' * v'_R - u'_Y * v'_R} * (L_{Rg} + L_{Gg} + L_{Bg})}{1 + \frac{u'_R * v'_Y - u' * v'_Y}{u' * v'_R - u'_Y * v'_R}} \\ L_{Yg} = L_{Rg} + L_{Gg} + L_{Bg} - L_{Xg} \end{cases} \quad (3)$$

The coordinate of the target point is (u', v'), the CIEs of the corresponding RGB grayscale values are $R(u'_R, v'_R)$, $G(u'_G, v'_G)$, $B(u'_B, v'_B)$, the brightness values formed by the RGB grayscale values are respectively $L_{Rg}$, $L_{Gg}$, and $L_{Bg}$, and the CIE of the second dynamic sub-pixel is $Y(u'_Y, v'_Y)$.

When the target point coordinate falls within the WGB gamut block, the CIE of the first dynamic sub-pixel is red CIE. As shown in FIG. 2, the triangle formed by the connecting lines of the three points WGB is not capable of covering the curves formed by the edge lines of the graphene. Further, when the target point coordinate falls within the WBR gamut block, transformation is needed when the target point coordinate is unable to replace the point coordinate of the mixed color of the first dynamic sub-pixel and the second dynamic sub-pixel.

Specifically, when the target point coordinate is denoted by A(u', v'), the CIE of the second dynamic sub-pixel is the CIE of the intersection (Y) between the connecting line of the target point coordinate (A) and the point coordinate (R) corresponding to the first dynamic sub-pixel and the edge lines configured by the graphene display device.

The CIE of the second dynamic sub-pixel may be obtained by looking at the table via the slope factor, and which is $Y(u'_Y, v'_Y)$. The intersection between the connecting lines of points WB and the connecting lines of points RY is C, and the intersection between the connecting lines of points GB an the connecting lines of points RY is E. Assuming the point coordinate of the mixed color of the first dynamic sub-pixel and the second dynamic sub-pixel is D, the equation AC/EC=DC/YC may be obtained by a great deal of experiments so as to obtain the CIE of the mixed color of the first dynamic sub-pixel and the second dynamic sub-pixel, which is $D(u'_D, v'_D)$.

Equation (4) may be obtained by the relationship between the $D(u'_D, v'_D)$ and the two dynamic sub-pixels and the relationship between the brightness formed by the grayscale values of the first dynamic sub-pixel, the second dynamic sub-pixel, and the RGB.

$$\begin{cases} v'_D = \dfrac{L_{Xg} + L_{Yg}}{\dfrac{L_{Xg}}{v'_R} + \dfrac{L_{Yg}}{v'_Y}} \\ L_{Xg} + L_{Yg} = L_{Rg} + L_{Gg} + L_{Bg} \end{cases} \quad (4)$$

The brightness values formed by the RGB grayscale values are respectively $L_{Rg}$, $L_{Gg}$, and $L_{Bg}$, the CIE of the second dynamic sub-pixel is $Y(u'_Y, v'_Y)$, the brightness value formed by the grayscale value of the first dynamic sub-pixel is $L_{Xg}$, and the brightness value formed by the grayscale value of the second dynamic sub-pixel is $L_{Yg}$.

Further, the brightness value formed by the grayscale value of the first dynamic sub-pixel $L_{Xg}$ and the brightness value formed by the grayscale value of the second dynamic sub-pixel $L_{Yg}$ may be obtained, as shown by equation (5):

$$\begin{cases} L_{Xg} = \dfrac{\dfrac{u'_R * v'_Y - u'_D * v'_Y}{u'_D * v'_R - u'_Y * v'_R} * (L_{Rg} + L_{Gg} + L_{Bg})}{1 + \dfrac{u'_R * v'_Y - u'_D * v'_Y}{u'_D * v'_R - u'_Y * v'_R}} \\ L_{Yg} = L_{Rg} + L_{Gg} + L_{Bg} - L_{Xg} \end{cases} \quad (5)$$

The point coordinate of the mixed color of the first dynamic sub-pixel and the second dynamic sub-pixel is $D(u'_D, v'_D)$, the CIEs corresponding to the RGB grayscale values are $R(u'_R, v'_R)$, $G(u'_G, v'_G)$, and $B(u'_B, v'_B)$, the brightness values formed by the RGB grayscale values are respectively $L_{Rg}$, $L_{Gg}$, and $L_{Bg}$, and the CIE of the second dynamic sub-pixel is $Y(u'_Y, v'_Y)$.

When the target point coordinate falls within the WGR gamut block, the CIE of the first dynamic sub-pixel is blue CIE. Similar to the condition when the target point coordinate falls within the WGB gamut block, as the triangle formed by the connecting lines of the three points WGR is not capable of covering the curves formed by the edge lines of the graphene, when the target point coordinate falls within the WGR gamut block, transformation is needed when the target point coordinate is unable to replace the point coordinate of the mixed color of the first dynamic sub-pixel and the second dynamic sub-pixel.

Specifically, similar to the transformation conducted when the target point coordinate falls within the WGB gamut block, when the target point coordinate is denoted by A(u', v'), the CIE of the second dynamic sub-pixel is the CIE of the intersection (Y) between the connecting line of the target point coordinate (A) and the point coordinate (B) corresponding to the first dynamic sub-pixel and the edge lines configured by the graphene display device. The CIE of the second dynamic sub-pixel may be obtained by looking at the table via the slope factor, and which is $Y(u'_Y, v'_Y)$. The intersection between the connecting lines of points WG and the connecting lines of points BY is C, and the intersection between the connecting lines of points GR an the connecting lines of points BY is E. Assuming the point coordinate of the mixed color of the first dynamic sub-pixel and the second dynamic sub-pixel is D, the equation AC/EC=DC/YC may be obtained by a great deal of experiments so as to obtain the point coordinate of the mixed color of the first dynamic sub-pixel and the second dynamic sub-pixel, which is $D(u'_D, v'_D)$.

Equation (6) may be obtained by the relationship between the $D(u'_D, v'_D)$ and the two dynamic sub-pixels and the relationship between the brightness formed by the grayscale values of the first dynamic sub-pixel, the second dynamic sub-pixel, and the RGB.

$$\begin{cases} v'_D = \dfrac{L_{Xg} + L_{Yg}}{\dfrac{L_{Xg}}{v'_R} + \dfrac{L_{Yg}}{v'_Y}} \\ L_{Xg} + L_{Yg} = L_{Rg} + L_{Gg} + L_{Bg} \end{cases} \quad (6)$$

The brightness values formed by the RGB grayscale values are respectively $L_{Rg}$, $L_{Gg}$, and $L_{Bg}$, the CIE of the second dynamic sub-pixel is $Y(u'_Y, v'_Y)$, the brightness value formed by the grayscale value of the first dynamic sub-pixel is $L_{Xg}$, and the brightness value formed by the grayscale value of the second dynamic sub-pixel is $L_{Yg}$.

Further, the brightness value formed by the grayscale value of the first dynamic sub-pixel $L_{Xg}$ and the brightness value formed by the grayscale value of the second dynamic sub-pixel $L_{Yg}$ may be obtained, as shown by equation (7):

$$\begin{cases} L_{Xg} = \dfrac{\dfrac{u'_R * v'_Y - u'_D * v'_Y}{u'_D * v'_R - u'_Y * v'_R} * (L_{Rg} + L_{Gg} + L_{Bg})}{1 + \dfrac{u'_R * v'_Y - u'_D * v'_Y}{u'_D * v'_R - u'_Y * v'_R}} \\ L_{Yg} = L_{Rg} + L_{Gg} + L_{Bg} - L_{Xg} \end{cases} \quad (7)$$

The point coordinate of the mixed color of the first dynamic sub-pixel and the second dynamic sub-pixel is $D(u'_D, v'_D)$, the CIEs corresponding to the RGB grayscale values are $R(u'_R, v'_R)$, $G(u'_G, v'_G)$, and $B(u'_B, v'_B)$, the brightness values formed by the RGB grayscale values are respectively $L_{Rg}$, $L_{Gg}$, and $L_{Bg}$, and the CIE of the second dynamic sub-pixel is $Y(u'_Y, v'_Y)$.

In step 103, a driving voltage of the pixel is determined in accordance with the point coordinate or brightness of the first dynamic sub-pixel and the second dynamic sub-pixel.

With respect to the graphene display device, when the gate voltage is different, the pixels may emit beams of different colors. For instance, the pixels emit red beams when the gate unit is within a range between 0 and 10 V and when the source/drain voltage Vds is greater than a turn-on voltage (Vth). The pixels emit green beams when the gate unit is within a range between 20 and 30 V and when the source/drain voltage Vds is greater than turn-on voltage (Vth). The pixels emit blue beams when the gate unit is within a range between 40 and 50 V and when the source/drain voltage Vds is greater than turn-on voltage (Vth). Thus, the color displayed by the graphene display device may be changed by configuring the driving voltage. That is, the grayscale value may be configured. Similarly, the driving voltage of the graphene display device may be determined in accordance with the grayscale value of the graphene display device.

In step 104, outputting the driving voltage to the pixel.

After the driving voltage of the pixel corresponding to the graphene display device is determined by the CIE or the brightness of the first dynamic sub-pixel and the second dynamic sub-pixel, the driving voltage is outputted to the pixel. Correspondingly, the graphene display device displays the corresponding color.

Compared to the conventional technology, each of the pixels of the graphene display device includes two dynamic sub-pixels. The target point coordinate of the pixel within the gamut coordinate system is determined in accordance with the inputted RGB grayscale values. The CIE or the brightness of the first dynamic sub-pixel and the second dynamic sub-pixel may be obtained by the relationship of the three gamut blocks divided by the target point coordinate and the RGB color gamut. The driving voltage of the pixel may be determined by the CIE or the brightness of the first dynamic sub-pixel and the second dynamic sub-pixel, and is outputted. In this way, the gamut display of the graphene display device may reach up to 158%, which is more than any other displays. The gamut of the graphene display device may completely cover the gamut range of real objects. The quality of displayed color and the performance of the display may be greatly enhanced.

Figure 3:
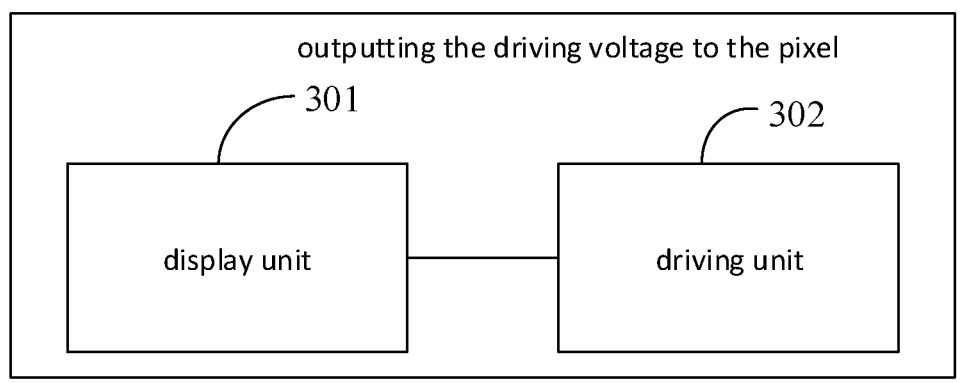
FIG. 3 is a schematic view of the graphene display device in accordance with one embodiment.

FIG. 3 is a schematic view of the graphene display device in accordance with one embodiment. As shown in FIG. 3, the graphene display device includes a display unit 301 and a driving unit 302. The display unit 301 electrically connects with the driving unit 302. The display unit 301 includes a plurality of pixels, and each of the pixels includes two dynamic sub-pixels.

Figure 4:
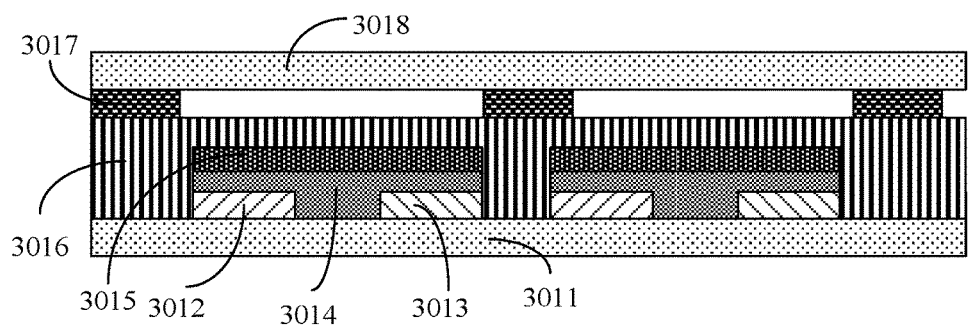
FIG. 4 is a schematic view of the display unit of the graphene display device in accordance with one embodiment.

Specifically, as shown in FIG. 4, the display unit 301 includes a down substrate 3011, and a source 3012 and a drain 3013 on the down substrate 3011. The source 3012 and the drain 3013 are separated by a trench. In addition, the source 3012, the drain 3013, and the trench are covered by a light-emitting layer 3014. A gate 3015 is formed on the light-emitting layer 3014. The display unit 301 also includes a protection layer 3016 on the gate 3015, a black matrix layer 3017 on the protection layer 3016, and a top substrate 3018 on the black matrix layer 3017.

The down substrate 3011 may be made by one of PET, glass, and nickel. A surface of the down substrate 3011 facing away the source 3012 and the drain 3013 is provided with a metallic reflective layer having high reflective rate. The source 3012 and the drain 3013 may be made by reduced graphene oxide nanosheets (r-GO), and the protection layer 3016 may be made by graphene oxide (GO). The light-emitting layer 3014 may be made by reduced graphene oxide semiconductor, and the top substrate 3018 may be made by one of water of oxygen and organic material and glass.

The display unit 301 is configured for obtaining the target point coordinate of the pixel within the gamut coordinate system in accordance with the RGB grayscale value inputted by the pixel.

Specifically, the display unit 301 divides the RGB color gamut of the graphene display device into three color gamut including WBR, WGR, and WBG to obtain the color or the CIE of the two dynamic sub-pixels corresponding to the inputted RGB grayscale values. Preferably, in order to provide more smooth color transition of each of the color gamut block and the whole color gamut, in the embodiment, uniform color coordinate system is adopted, such as CIE1976.

After the color gamut blocks are divided, the graphene display device determines the target point coordinate system of the corresponding pixel within the color gamut system. In an example, the coordinate of the target point is (u', v'), the CIEs of the corresponding RGB grayscale values are R(u'$_R$, v'$_R$), G(u'$_G$, v'$_G$), B(u'$_B$, v'$_B$), and the brightness values formed by the RGB grayscale values are respectively L$_{Rg}$, L$_{Gg}$, and L$_{Bg}$. The target CIE (u', v') may be obtained by equation (1).

$$\begin{cases} u' = \dfrac{u'_R \times \dfrac{L_{Rg}}{v'_R} + u'_G \times \dfrac{L_{Gg}}{v'_G} + u'_B \times \dfrac{L_{Bg}}{v'_B}}{\dfrac{L_{Rg}}{v'_R} + \dfrac{L_{Gg}}{v'_G} + \dfrac{L_{Bg}}{v'_B}} \\ v' = \dfrac{L_{Rg} + L_{Gg} + L_{Bg}}{\dfrac{L_{Rg}}{v'_R} + \dfrac{L_{Gg}}{v'_G} + \dfrac{L_{Bg}}{v'_B}} \end{cases} \quad (1)$$

The display unit 301 also obtains the CIE or the brightness of the first dynamic sub-pixel and the second dynamic sub-pixel of the pixel according to a location relationship of the three color gamut blocks within the target point coordinate and the color gamut coordinate system divided by the RGB color gamut.

Specifically, when the target point coordinate is within the WBR color gamut block, the CIE of the first dynamic sub-pixel is the red CIE. When the target point coordinate is within the WGR color gamut block, the CIE of the first dynamic sub-pixel is the blue CIE. when the target point coordinate is within the WBG color gamut block, the CIE of the first dynamic sub-pixel is the red CIE.

After the target point coordinate is determined by the display unit 301, the CIE of the second dynamic sub-pixel is determined in accordance with an intersection of a connecting line between the target point coordinate and the color corresponding to the first dynamic sub-pixel and an edge line defining the gamut. Specifically, the CIE of the second dynamic sub-pixel is determined by referring to a predetermined table via a slope factor of the connecting line between the target point coordinate and the CIE of the color corresponding to the first dynamic sub-pixel.

Further, when the target point coordinate falls within the WBR gamut block, the CIE of the first dynamic sub-pixel is red CIE. As shown in FIG. 2, the triangle formed by the connecting lines of the three points WBR substantially overlap with the edge lines of the graphene. When the target point coordinate falls within the WBR gamut block, the point coordinate of the mixed color of the first dynamic sub-pixel and the second dynamic sub-pixel is replaced by the target point coordinate. In addition, a target brightness value formed by the RGB grayscale value is taken as the brightness value of the mixed color of the first dynamic sub-pixel and the second dynamic sub-pixel, as shown by equation (2) below.

$$\begin{cases} v' = \dfrac{L_{Xg} + L_{Yg}}{\dfrac{L_{Xg}}{v'_R} + \dfrac{L_{Yg}}{v'_Y}} \\ L_{Xg} + L_{Yg} = L_{Rg} + L_{Gg} + L_{Bg} \end{cases} \quad (2)$$

The coordinate of the target point is (u', v'), the brightness values formed by the RGB grayscale values are respectively $L_{Rg}$, $L_{Gg}$, and $L_{Bg}$, the CIE of the second dynamic sub-pixel is $Y(u'_Y, v'_Y)$, the brightness value formed by the grayscale value of the first dynamic sub-pixel is $L_{Xg}$, and the brightness value formed by the grayscale value of the second dynamic sub-pixel is $L_{Yg}$.

The CIE obtained by equation (1) is taken into equation (2) for calculation to obtain the brightness value formed by the grayscale value of the first dynamic sub-pixel $L_{Xg}$ and the brightness value formed by the grayscale value of the second dynamic sub-pixel $L_{Yg}$, as shown by equation (3).

$$\begin{cases} L_{Xg} = \dfrac{\dfrac{u'_R * v'_Y - u' * v'_Y}{u' * v'_R - u'_Y * v'_R} * (L_{Rg} + L_{Gg} + L_{Bg})}{1 + \dfrac{u'_R * v'_Y - u' * v'_Y}{u' * v'_R - u'_Y * v'_R}} \\ L_{Yg} = L_{Rg} + L_{Gg} + L_{Bg} - L_{Xg} \end{cases} \quad (3)$$

The coordinate of the target point is (u', v'), the CIEs of the corresponding RGB grayscale values are $R(u'_R, v'_R)$, $G(u'_G, v'_G)$, $B(u'_B, v'_B)$, the brightness values formed by the RGB grayscale values are respectively $L_{Rg}$, $L_{Gg}$, and $L_{Bg}$, and the CIE of the second dynamic sub-pixel is $Y(u'_Y, v'_Y)$.

When the target point coordinate falls within the WGB gamut block, the CIE of the first dynamic sub-pixel is red CIE. As shown in FIG. 2, the triangle formed by the connecting lines of the three points WGB is not capable of covering the curves formed by the edge lines of the graphene. Further, when the target point coordinate falls within the WBR gamut block, transformation is needed when the target point coordinate is unable to replace the point coordinate of the mixed color of the first dynamic sub-pixel and the second dynamic sub-pixel. Specifically, when the target point coordinate is denoted by A(u', v'), the CIE of the second dynamic sub-pixel is the CIE of the intersection (Y) between the connecting line of the target point coordinate (A) and the point coordinate (R) corresponding to the first dynamic sub-pixel and the edge lines configured by the graphene display device.

The CIE of the second dynamic sub-pixel may be obtained by looking at the table via the slope factor, and which is $Y(u'_Y, v'_Y)$. The intersection between the connecting lines of points WB and the connecting lines of points RY is C, and the intersection between the connecting lines of points GB an the connecting lines of points RY is E. Assuming the point coordinate of the mixed color of the first dynamic sub-pixel and the second dynamic sub-pixel is D, the equation AC/EC=DC/YC may be obtained by a great deal of experiments so as to obtain the point coordinate of the mixed color of the first dynamic sub-pixel and the second dynamic sub-pixel, which is $D(u'_D, v'_D)$.

Equation (4) may be obtained by the relationship between the $D(u'_D, v'_D)$ and the two dynamic sub-pixels and the relationship between the brightness formed by the grayscale values of the first dynamic sub-pixel, the second dynamic sub-pixel, and the RGB.

$$\begin{cases} v'_D = \dfrac{L_{Xg} + L_{Yg}}{\dfrac{L_{Xg}}{v'_R} + \dfrac{L_{Yg}}{v'_Y}} \\ L_{Xg} + L_{Yg} = L_{Rg} + L_{Gg} + L_{Bg} \end{cases} \quad (4)$$

The brightness values formed by the RGB grayscale values are respectively $L_{Rg}$, $L_{Gg}$, and $L_{Bg}$, the CIE of the second dynamic sub-pixel is $Y(u'_Y, v'_Y)$, the brightness value formed by the grayscale value of the first dynamic sub-pixel is $L_{Xg}$, and the brightness value formed by the grayscale value of the second dynamic sub-pixel is $L_{Yg}$.

Further, the brightness value formed by the grayscale value of the first dynamic sub-pixel $L_{Xg}$ and the brightness value formed by the grayscale value of the second dynamic sub-pixel $L_{Yg}$ may be obtained, as shown by equation (5):

$$\begin{cases} L_{Xg} = \dfrac{\dfrac{u'_R * v'_Y - u'_D * v'_Y}{u'_D * v'_R - u'_Y * v'_R} * (L_{Rg} + L_{Gg} + L_{Bg})}{1 + \dfrac{u'_R * v'_Y - u'_D * v'_Y}{u'_D * v'_R - u'_Y * v'_R}} \\ L_{Yg} = L_{Rg} + L_{Gg} + L_{Bg} - L_{Xg} \end{cases} \quad (5)$$

The point coordinate of the mixed color of the first dynamic sub-pixel and the second dynamic sub-pixel is $D(u'_D, v'_D)$, the CIEs corresponding to the RGB grayscale values are $R(u'_R, v'_R)$, $G(u'_G, v'_G)$, and $B(u'_B, v'_B)$, the brightness values formed by the RGB grayscale values are respectively $L_{Rg}$, $L_{Gg}$, and $L_{Bg}$, and the CIE of the second dynamic sub-pixel is $Y(u'_Y, v'_Y)$.

When the target point coordinate falls within the WGR gamut block, the CIE of the first dynamic sub-pixel is blue CIE. Similar to the condition when the target point coordinate falls within the WGB gamut block, as the triangle formed by the connecting lines of the three points WGR is not capable of covering the curves formed by the edge lines of the graphene, when the target point coordinate falls within the WGR gamut block, transformation is needed when the target point coordinate is unable to replace the point coordinate of the mixed color of the first dynamic sub-pixel and the second dynamic sub-pixel.

Specifically, similar to the transformation conducted when the target point coordinate falls within the WGB gamut block, when the target point coordinate is denoted by A(u', v'), the CIE of the second dynamic sub-pixel is the CIE of the intersection (Y) between the connecting line of the target point coordinate (A) and the point coordinate (B) corresponding to the first dynamic sub-pixel and the edge lines configured by the graphene display device. The CIE of the second dynamic sub-pixel may be obtained by looking at the table via the slope factor, and which is $Y(u'_Y, v'_Y)$. The intersection between the connecting lines of points WG and the connecting lines of points BY is C, and the intersection between the connecting lines of points GR an the connecting lines of points BY is E. Assuming the point coordinate of the mixed color of the first dynamic sub-pixel and the second dynamic sub-pixel is D, the equation AC/EC=DC/YC may be obtained by a great deal of experiments so as to obtain the point coordinate of the mixed color of the first dynamic sub-pixel and the second dynamic sub-pixel, which is $D(u'_D, v'_D)$.

Equation (6) may be obtained by the relationship between the $D(u'_D, v'_D)$ and the two dynamic sub-pixels and the relationship between the brightness formed by the grayscale values of the first dynamic sub-pixel, the second dynamic sub-pixel, and the RGB.

$$\begin{cases} v'_D = \dfrac{L_{Xg} + L_{Yg}}{\dfrac{L_{Xg}}{v'_R} + \dfrac{L_{Yg}}{v'_Y}} \\ L_{Xg} + L_{Yg} = L_{Rg} + L_{Gg} + L_{Bg} \end{cases} \quad (6)$$

The brightness values formed by the RGB grayscale values are respectively $L_{Rg}$, $L_{Gg}$, and $L_{Bg}$, the CIE of the second dynamic sub-pixel is $Y(u'_Y, v'_Y)$, the brightness value formed by the grayscale value of the first dynamic sub-pixel is $L_{Xg}$, and the brightness value formed by the grayscale value of the second dynamic sub-pixel is $L_{Yg}$.

Further, the brightness value formed by the grayscale value of the first dynamic sub-pixel $L_{Xg}$ and the brightness value formed by the grayscale value of the second dynamic sub-pixel $L_{Yg}$ may be obtained, as shown by equation (7):

$$\begin{cases} L_{Xg} = \dfrac{\dfrac{u'_R * v'_Y - u'_D * v'_Y}{u'_D * v'_R - u'_Y * v'_R} * (L_{Rg} + L_{Gg} + L_{Bg})}{1 + \dfrac{u'_R * v'_Y - u'_D * v'_Y}{u'_D * v'_R - u'_Y * v'_R}} \\ L_{Yg} = L_{Rg} + L_{Gg} + L_{Bg} - L_{Xg} \end{cases} \quad (7)$$

The point coordinate of the mixed color of the first dynamic sub-pixel and the second dynamic sub-pixel is $D(u'_D, v'_D)$ the CIEs corresponding to the RGB grayscale values are $R(u'_R, v'_R)$, $G(u'_G, v'_G)$, and $B(u'_B, v'_B)$, the brightness values formed by the RGB grayscale values are respectively $L_{Rg}$, $L_{Gg}$, and $L_{Bg}$, and the CIE of the second dynamic sub-pixel is $Y(u'_Y, v'_Y)$.

The display unit 301 also configures a driving voltage of the pixel in accordance with the point coordinate or brightness of the first dynamic sub-pixel and the second dynamic sub-pixel.

With respect to the graphene display device, when the gate voltage is different, the pixels may emit beams of different colors. For instance, the pixels emit red beams when the gate unit is within a range between 0 and 10 V and when the source/drain voltage Vds is greater than a turn-on voltage (Vth). The pixels emit green beams when the gate unit is within a range between 20 and 30 V and when the source/drain voltage Vds is greater than turn-on voltage (Vth). The pixels emit blue beams when the gate unit is within a range between 40 and 50 V and when the source/drain voltage Vds is greater than turn-on voltage (Vth). Thus, the color displayed by the graphene display device may be changed by configuring the driving voltage. That is, the grayscale value may be configured. Similarly, the driving voltage of the graphene display device may be configured by the display unit 301 in accordance with the grayscale value of the graphene display device.

The driving unit 302 is configured for outputting the driving voltage.

After the driving voltage of the pixel corresponding to the graphene display device is determined by the CIE or the brightness of the first dynamic sub-pixel and the second dynamic sub-pixel, the driving unit 302 outputs the driving voltage. Correspondingly, the graphene display device displays the corresponding color.

Compared to the conventional technology, each of the pixels of the graphene display device includes two dynamic sub-pixels. The target point coordinate of the pixel within the gamut coordinate system is determined in accordance with the inputted RGB grayscale values. The CIE or the brightness of the first dynamic sub-pixel and the second dynamic sub-pixel may be obtained by the relationship of the three gamut blocks divided by the target point coordinate and the RGB color gamut. The driving voltage of the pixel may be determined by the CIE or the brightness of the first dynamic sub-pixel and the second dynamic sub-pixel, and is outputted. In this way, the gamut display of the graphene display device may reach up to 158%, which is more than any other displays. The gamut of the graphene display device may completely cover the gamut range of real objects. The quality of displayed color and the performance of the display may be greatly enhanced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A driving method of graphene display devices, each of the pixels of the graphene display device comprises two dynamic sub-pixels, the method comprising:
   obtaining target point coordinates of a pixel within a color gamut system by RGB grayscale values to be inputted by the pixels;
   obtaining chromaticity coordinate (CIE) or a brightness of a first dynamic sub-pixel and a second dynamic sub-pixel of the pixel according to a location relationship of three color gamut blocks divided by a RGB color gamut within the target point coordinate and a gamut coordinate system;
   determining a driving voltage of the pixel in accordance with the CIE or the brightness of the first dynamic sub-pixel and the second dynamic sub-pixel; and
   outputting the driving voltage to the pixel;
   wherein the step of obtaining the CIE or a brightness of a first dynamic sub-pixel and a second dynamic sub-pixel of the pixel according to a location relationship of three color gamut blocks divided by a RGB color gamut within the target point coordinate and a gamut coordinate system further comprises:
   determining the gamut block where the target point coordinate falls;
   determining the CIE of the first dynamic sub-pixel and the second dynamic sub-pixel in accordance with the gamut block where the target point coordinate falls and a location of the target point coordinate within the gamut block; and
   obtaining the brightness of the first dynamic sub-pixel and the second dynamic sub-pixel in accordance with the target point coordinate, a brightness value formed by the RGB grayscale values, the CIE of the first dynamic sub-pixel and the CIE of the second dynamic sub-pixel.

2. The method as claimed in claim 1, wherein the step of obtaining the brightness of the first dynamic sub-pixel and the second dynamic sub-pixel in accordance with the target point coordinate, a brightness value formed by the RGB grayscale values, the CIE of the first dynamic sub-pixel and the CIE of the second dynamic sub-pixel further comprises:

taking the CIE of the target point coordinate as the CIE of a mixed color of the two dynamic sub-pixels and taking the target brightness value formed by the RGB grayscale value as the brightness value of a mixed color of the two dynamic sub-pixels; and respectively obtaining the brightness of the two dynamic sub-pixels in accordance with the respective brightness, the CIEs, and a relationship between the CIE and the brightness of the mixed color of the two dynamics sub-pixels.

3. The method as claimed in claim 2, wherein the step of obtaining the target point coordinates of a pixel within a color gamut system by RGB grayscale values to be inputted by the pixels further comprises:

configuring the CIE corresponding to the inputted RGB grayscale values to respectively be $R(u'_R, v'_R)$, $G(u'_G, v'_G)$, and $B(u'_B, v'_B)$, and according to equation (1):

$$\begin{cases} u' = \dfrac{u'_R \times \frac{L_{Rg}}{v'_R} + u'_G \times \frac{L_{Gg}}{v'_G} + u'_B \times \frac{L_{Bg}}{v'_B}}{\frac{L_{Rg}}{v'_R} + \frac{L_{Gg}}{v'_G} + \frac{L_{Bg}}{v'_B}} \\ v' = \dfrac{L_{Rg} + L_{Gg} + L_{Bg}}{\frac{L_{Rg}}{v'_R} + \frac{L_{Gg}}{v'_G} + \frac{L_{Bg}}{v'_B}} \end{cases} \quad (1)$$

the target point coordinate is (u', v'), wherein the brightness formed by the RGB grayscale values are respectively $L_{Rg}$, $L_{Gg}$, and $L_{Bg}$.

4. The method as claimed in claim 2, wherein the step of respectively obtaining the brightness of the two dynamic sub-pixels in accordance with the respective brightness, the CIEs, and a relationship between the CIE and the brightness of the mixed color of the two dynamics sub-pixels further comprises:

obtaining the brightness value formed by the grayscale value of the first dynamic sub-pixel ($L_{Xg}$) and the brightness value formed by the grayscale value of the second dynamic sub-pixel ($L_{Yg}$) by equation (2):

$$\begin{cases} L_{Xg} = \dfrac{\frac{u'_R * v'_Y - u'_D * v'_Y}{u'_D * v'_R - u'_Y * v'_R} * (L_{Rg} + L_{Gg} + L_{Bg})}{1 + \frac{u'_R * v'_Y - u'_D * v'_Y}{u'_D * v'_R - u'_Y * v'_R}} \\ L_{Yg} = L_{Rg} + L_{Gg} + L_{Bg} - L_{Xg} \end{cases} \quad (2)$$

wherein the CIEs of the corresponding RGB grayscale values are $R(u'_R, v'_R)$, $G(u'_G, v'_G)$, $B(u'_B, v'_B)$, the brightness values formed by the RGB grayscale values are respectively $L_{Rg}$, $L_{Gg}$, and $L_{Bg}$, the CIE of the second dynamic sub-pixel is $Y(u'_Y, v'_Y)$, and the CIE of the mixed color of the first dynamic sub-pixel and the second dynamic sub-pixel is $D(u'_D, v'_D)$; and the CIE (D) is obtained by converting the target point coordinate.

5. The method as claimed in claim 1, wherein before the step of obtaining target point coordinates of a pixel within a color gamut system by RGB grayscale values to be inputted by the pixels, the method further comprises:

dividing the RGB color gamut into three gamut blocks WBR, WGR, and WBG.

6. The method as claimed in claim 5, wherein the step of determining the CIE of the first dynamic sub-pixel and the second dynamic sub-pixel in accordance with the gamut block where the target point coordinate falls and a location of the target point coordinate within the gamut block further comprises:

when the target point coordinate is within the WBR color gamut block, the CIE of the first dynamic sub-pixel is the red CIE;

when the target point coordinate is within the WGR color gamut block, the CIE of the first dynamic sub-pixel is the blue CIE;

when the target point coordinate is within the WBG color gamut block, the CIE of the first dynamic sub-pixel is the red CIE; and the CIE of the second dynamic sub-pixel is the CIE of an intersection between a connecting line of the target point coordinate and the CIE corresponding to the first dynamic sub-pixel and edge lines configured by the graphene display device.

7. A graphene display device, comprising:

a display unit and a driving unit electrically connecting to the display unit, the display unit comprises a plurality of pixels, each of the pixels comprises two dynamic sub-pixels, the display unit obtains a target point coordinate of the pixel within a gamut coordinate system in accordance with the inputted RGB grayscale values, the display unit also obtains chromaticity coordinate (CIE) or brightness of the first dynamic sub-pixel and the second dynamic sub-pixel in accordance with a location relationship of three color gamut blocks divided by a RGB color gamut within the target point coordinate and a gamut coordinate system;

the display unit also determines a driving voltage of the pixel in accordance with the CIE or the brightness of the first dynamic sub-pixel and the second dynamic sub-pixel; and the driving unit outputs the driving voltage to the pixel; wherein the display unit:

determines the gamut block where the target point coordinate falls;

determines the CIE of the first dynamic sub-pixel and the second dynamic sub-pixel in accordance with the gamut block where the target point coordinate falls and a location of the target point coordinate within the gamut block; and obtains the brightness of the first dynamic sub-pixel and the second dynamic sub-pixel in accordance with the target point coordinate, a brightness value formed by the RGB grayscale values, the CIE of the first dynamic sub-pixel and the CIE of the second dynamic sub-pixel.

8. The graphene display device as claimed in claim 7, wherein the display unit:

takes the CIE of the target point coordinate as the CIE of a mixed color of the two dynamic sub-pixels and takes the target brightness value formed by the RGB grayscale value as the brightness value of the mixed color of the two dynamic sub-pixels; and respectively obtains the brightness of the two dynamic sub-pixels in accordance with the respective brightness, the CIEs, and a relationship between the CIE and the brightness of the mixed color of the two dynamics sub-pixels.

9. The graphene display device as claimed in claim 8, wherein the display unit configures the CIE corresponding to the inputted RGB grayscale values to respectively be $R(u'_R, v'_R)$, $G(u'_G, v'_G)$, and $B(u'_B, v'_B)$, and according to equation (1):

$$\begin{cases} u' = \dfrac{u'_R \times \dfrac{L_{Rg}}{v'_R} + u'_G \times \dfrac{L_{Gg}}{v'_G} + u'_B \times \dfrac{L_{Bg}}{v'_B}}{\dfrac{L_{Rg}}{v'_R} + \dfrac{L_{Gg}}{v'_G} + \dfrac{L_{Bg}}{v'_B}} \\ v' = \dfrac{L_{Rg} + L_{Gg} + L_{Bg}}{\dfrac{L_{Rg}}{v'_R} + \dfrac{L_{Gg}}{v'_G} + \dfrac{L_{Bg}}{v'_B}} \end{cases} \quad (1)$$

the target point coordinate is (u', v'), wherein the brightness formed by the RGB grayscale values are respectively $L_{Rg}$, $L_{Gg}$, and $L_{Bg}$.

10. The graphene display device as claimed in claim 8, wherein the display unit obtains the brightness value formed by the grayscale value of the first dynamic sub-pixel ($L_{Xg}$) and the brightness value formed by the grayscale value of the second dynamic sub-pixel ($L_{Yg}$) by equation (2):

$$\begin{cases} L_{Xg} = \dfrac{\dfrac{u'_R * v'_Y - u'_D * v'_Y}{u'_D * v'_R - u'_Y * v'_R} * (L_{Rg} + L_{Gg} + L_{Bg})}{1 + \dfrac{u'_R * v'_Y - u'_D * v'_Y}{u'_D * v'_R - u'_Y * v'_R}} \\ L_{Yg} = L_{Rg} + L_{Gg} + L_{Bg} - L_{Xg} \end{cases} \quad (2)$$

wherein the CIEs of the corresponding RGB grayscale values are $R(u'_R, v'_R)$, $G(u'_G, v'_G)$, $B(u'_B, v'_B)$, the brightness values formed by the RGB grayscale values are respectively $L_{Rg}$, $L_{Gg}$, and $L_{Bg}$, the CIE of the second dynamic sub-pixel is $Y(u'_Y, v'_Y)$, and the CIE of the mixed color of the first dynamic sub-pixel and the second dynamic sub-pixel is $D(u'_D, v'_D)$; and the CIE (D) is obtained by converting the target point coordinate.

11. The graphene display device as claimed in claim 7, wherein the display unit divides the RGB color gamut into three gamut blocks WBR, WGR, and WBG.

12. The graphene display device as claimed in claim 11, wherein the display unit is configured for:

when the target point coordinate is within the WBR color gamut block, the CIE of the first dynamic sub-pixel is the red CIE;

when the target point coordinate is within the WGR color gamut block, the CIE of the first dynamic sub-pixel is the blue CIE;

when the target point coordinate is within the WBG color gamut block, the CIE of the first dynamic sub-pixel is the red CIE; and the CIE of the second dynamic sub-pixel is the CIE of an intersection between a connecting line of the target point coordinate and the CIE corresponding to the first dynamic sub-pixel and edge lines configured by the graphene display device.

* * * * *